United States Patent
Hsueh et al.

(10) Patent No.: US 8,624,274 B2
(45) Date of Patent: Jan. 7, 2014

(54) METHODS FOR FORMING A PIXEL OF A MICRO-CHIP LIGHT-EMITTING DIODE LIGHT SOURCE AND A PLURALITY OF LIGHT-EMITTING DIODE PIXELS ARRANGED IN A TWO-DIMENSIONAL ARRAY

(75) Inventors: Han-Tsung Hsueh, Hsinchu (TW); Hsi-Hsuan Yen, Hsinchu (TW); Wen-Yung Yeh, Hsinchu (TW); Mu-Tao Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/215,214

(22) Filed: Aug. 22, 2011

(65) Prior Publication Data
US 2011/0300656 A1    Dec. 8, 2011

Related U.S. Application Data

(62) Division of application No. 11/979,568, filed on Nov. 6, 2007, now Pat. No. 8,022,421.

(51) Int. Cl.
*H01L 33/00*    (2010.01)

(52) U.S. Cl.
USPC .......... 257/89; 257/13; 257/79; 257/103; 257/918; 257/E51.022; 257/E33.001; 257/E33.054

(58) Field of Classification Search
USPC ............. 257/89, E33.005, 13, 79, 103, 918, 257/E51.018, E25.028; 438/35
See application file for complete search history.

(56) References Cited

U.S. PATENT DOCUMENTS

| | | | | |
|---|---|---|---|---|
| 5,739,552 A | * | 4/1998 | Kimura et al. | 257/89 |
| 5,952,681 A | * | 9/1999 | Chen | 257/89 |
| 2003/0047742 A1 | * | 3/2003 | Hen | 257/89 |
| 2006/0255347 A1 | * | 11/2006 | DenBaars et al. | 257/89 |

* cited by examiner

*Primary Examiner* — Marc Armand
(74) *Attorney, Agent, or Firm* — Jianq Chyun IP Office

(57) ABSTRACT

A method for forming a pixel of an LED light source is provided. The method includes: forming a first layer on a first substrate; forming a second layer and a first light-emitting active layer on the first layer; forming a first intermediate layer on the second layer; forming a third layer on a second substrate; forming a fourth layer and a second light-emitting active layer on the third layer; placing the third layer, the fourth layer, and the second light-emitting active layer on the first intermediate layer, wherein the first light-emitting active layer and the second light-emitting active layer emit different colors of light. A method for forming a plurality of light-emitting diode pixels arranged in a two-dimensional array is also provided.

7 Claims, 4 Drawing Sheets

METHODS FOR FORMING A PIXEL OF A MICRO-CHIP LIGHT-EMITTING DIODE LIGHT SOURCE AND A PLURALITY OF LIGHT-EMITTING DIODE PIXELS ARRANGED IN A TWO-DIMENSIONAL ARRAY

CROSS-REFERENCE TO RELATED APPLICATION

This application is a divisional application of and claims priority benefit of an application Ser. No. 11/979,568, filed on Nov. 6, 2007. The entirety of the above-mentioned patent application is hereby incorporated by reference herein and made a part of this specification.

FIELD OF THE INVENTION

This invention relates in general to methods for forming light emitting modules. More specifically, this invention relates to methods for forming light emitting modules including a substrate including multi-colored light emitting diodes.

BACKGROUND

Liquid crystal displays have been recently replacing traditional CRTs in applications like computer monitors and TVs. A liquid crystal display includes a glass cell as a light valve and a back light module as a light source. Back light modules usually comprise cold cathode fluorescent lamps and light directors. After light is emitted from the back light modules, it may be polarized first in order to be controlled by the aligned liquid crystals in the liquid crystal cell. Therefore, a first polarizer may be attached at the rear side of the glass cell and a second polarizer attached at the front side of the glass cell for controlling light emission in a transmission type liquid crystal display. After light goes through the first polarizer, at least half of the light energy would be blocked and can not contribute to the display. Therefore, several other display technologies have been developed to eliminate the use of polarizers.

Recently, light emitting diode-based displays have become a promising light source for displays. For example, light emitting diodes (LED) can be the light source of a projective type display. FIG. 7 shows a projective type display having LED array chips as its light source. The projective type display includes three single-colored LED array substrates 1R, 1G, and 1B, a dichroic lens 2, a projection lens 3, and a screen 4. Red light from red-colored LED substrate 1R, green light from green-colored LED substrate 1G, and blue light from blue-colored LED substrate 1B are mixed at dichroic lens 2 and are projected to the screen 2 via projection lens 3. Each substrate comprises only single-colored LED chips. An instance of such a substrate 1 is shown in FIG. 8. In this display, no liquid crystal panels or polarizers are needed, so light energy efficiency is improved as compared to the traditional liquid crystal display. But there is a need to integrate three-colored LED chips into one substrate to reduce the cost of light sources.

SUMMARY

Consistent with embodiments of the present invention, there is provided a method for forming a pixel of an LED light source. The method includes: forming a first layer on a first substrate; forming a second layer and a first light-emitting active layer on the first layer; forming a first intermediate layer on the second layer; forming a third layer on a second substrate; forming a fourth layer and a second light-emitting active layer on the third layer; cutting a portion of the second substrate including at least the third layer, the fourth layer, and the second light-emitting active layer; and placing the third layer, the fourth layer, and the second light-emitting active layer on the first intermediate layer, wherein the first light-emitting active layer and the second light-emitting active layer emit different colors of light.

Consistent with embodiments of the present invention, there is provided a method for forming a pixel of an LED light source. The method includes: forming a first layer on a first substrate; forming a second layer and a first light-emitting active layer on the first layer; forming a first intermediate layer on the second layer; forming a third layer on a second substrate; forming a fourth layer and a second light-emitting active layer on the third layer; placing the third layer, the fourth layer, and the second light-emitting active layer on the first intermediate layer, wherein the first light-emitting active layer and the second light-emitting active layer emit different colors of light.

Consistent with embodiments of the present invention, there is provided a method for forming a plurality of light-emitting diode pixels arranged in a two-dimensional array. The method includes: forming a plurality of first layers arranged in a two-dimensional array on a first substrate; forming a plurality of second layers and a plurality of first light-emitting active layers on the first layers correspondingly; forming a plurality of first intermediate layers on the second layers; forming a plurality of third layers arranged in a two-dimensional array on a second substrate; forming a plurality of fourth layers and a plurality of second light-emitting active layers on the third layers correspondingly; placing the third layers, the fourth layers, and the second light-emitting active layers on the first intermediate layers, wherein the first light-emitting active layers and the second light-emitting active layers emit different colors of light.

BRIEF DESCRIPTION OF THE DRAWINGS

The accompanying drawings, which are incorporated in and constitute a part of this specification, illustrate embodiments of the invention and, together with the description, serve to explain features, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts Consistent with embodiments of the present invention, there are provided methods for forming a micro-chip LED light source. A plurality of the micro-chip LED structures may be integrated on a single substrate and serves as a light source, for example, a light source for a projection display or a liquid crystal display.

Figure 1:
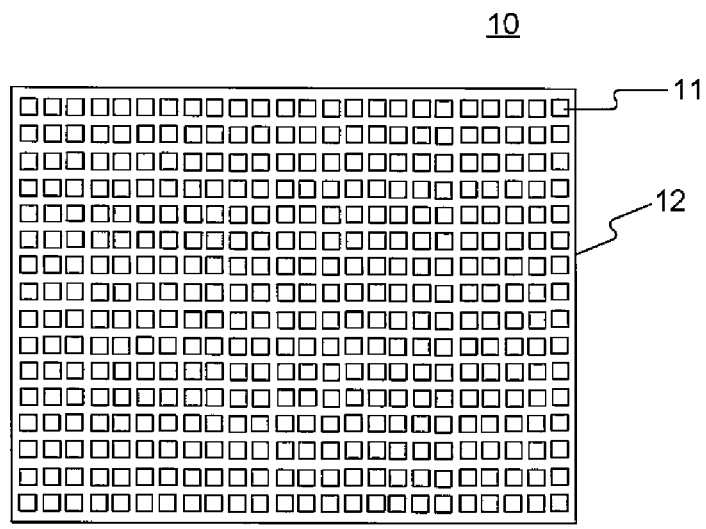
FIG. 1 shows a light emitting module including LED devices consistent with principles of the present invention.

FIG. 1 shows an embodiment consistent with the principles of the present invention. A light source 10 includes a plurality of pixels 11 arranged on a substrate 12 to form an array. The substrate may include, for example, $Al_2O_3$, GaAs, GaP, and SiC, or any combination of these materials. Each pixel 11 may at least comprise two micro-chip LED structures and each micro-chip LED structure may emit a different color of light. In accordance with an embodiment of the present invention, each pixel may include a red-colored LED, a green-colored LED, and a blue-colored LED, for example, so that a user of such light source can obtain a preferred color and intensity of light.

Figure 2:
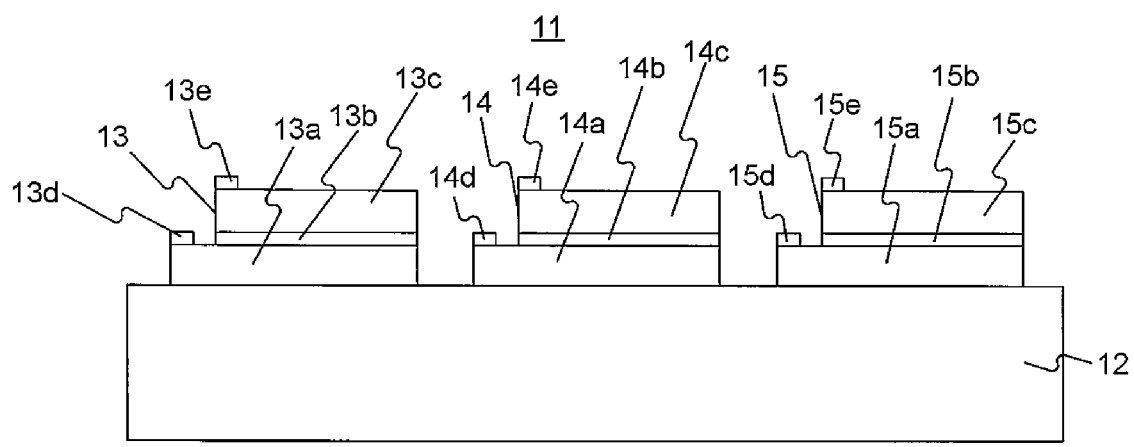
FIG. 2 shows a pixel of a light emitting module consistent with principles of the present invention.

FIG. 1 shows a light emitting module including LED devices consistent with principles of the present invention. As illustrated in FIG. 2, a pixel 11 of the light emitting module 10 may include three micro-chip LED structures 13, 14, and 15 formed on a substrate 12. At least one of the three micro-chip LED structures 13, 14, and 15 emits a color of light different from the others. In one aspect, the three micro-chip LED structures all emit different colors of light. For example, micro-chip LED structure 13 emits red light; micro-chip LED structure 14 emits green light; and micro-chip LED structure 15 emits blue light. By this arrangement, each pixel can produce a wide range of color. A process of forming pixel 11 will be explained as follows. A lower layer 13a of micro-chip LED structure 13 is formed on substrate 12. An upper layer 13c and a light-emitting active layer 13b are formed on the lower layer 13a. Layers 13a, 13b, and 13c may be deposited, for example, by conventional deposition techniques such as physical vapor deposition or chemical vapor deposition. In a process of forming upper layer 13c and light-emitting active layer 13b, at least a portion of an upper surface of lower layer 13a may be left uncovered by upper layer 13c and light-emitting active layer 13b. An electrode pad 13d is formed on the exposed upper surface of lower layer 13a, and a lead line (not shown) may be coupled to electrode pad 13d for inputting an electric current into the light-emitting active layer 13b. Similarly, an electrode pad 13e may be formed on a portion of an upper surface of upper layer 13c, and a lead line (not shown) may be coupled to electrode pad 13e.

Micro-chip LED structures 14 and 15 each may be formed using the same method as described above for forming micro-chip LED structure 13 on substrate 12. Electrode pads on each micro-chip LED structure 13, 14, and 15 may be formed, for example, simultaneously. For example, layers 13a, 13b, and 13c of micro-chip LED structure 13; layers 14a, 14b, and 14c of micro-chip LED structure 14; layers 15a, 15b, and 15c of micro-chip LED structure 15 may first be formed on substrate 12, and electrode pads 13d, 13e, 14d, 14e, 15d, and 15e may be formed simultaneously on a portion of the upper surfaces of layers 13a, 13c, 14a, 14c, 15a, and 15c, respectively. By independently inputting different electric currents to each micro-chip LED structures 13, 14, and 15 through the electrode pads, the color and the light intensity of pixel 11 can be controlled. Therefore, a light emitting module 10 shown in FIG. 1 including a pixel 11 can have improved light efficiency and color reproduction.

Figure 3:
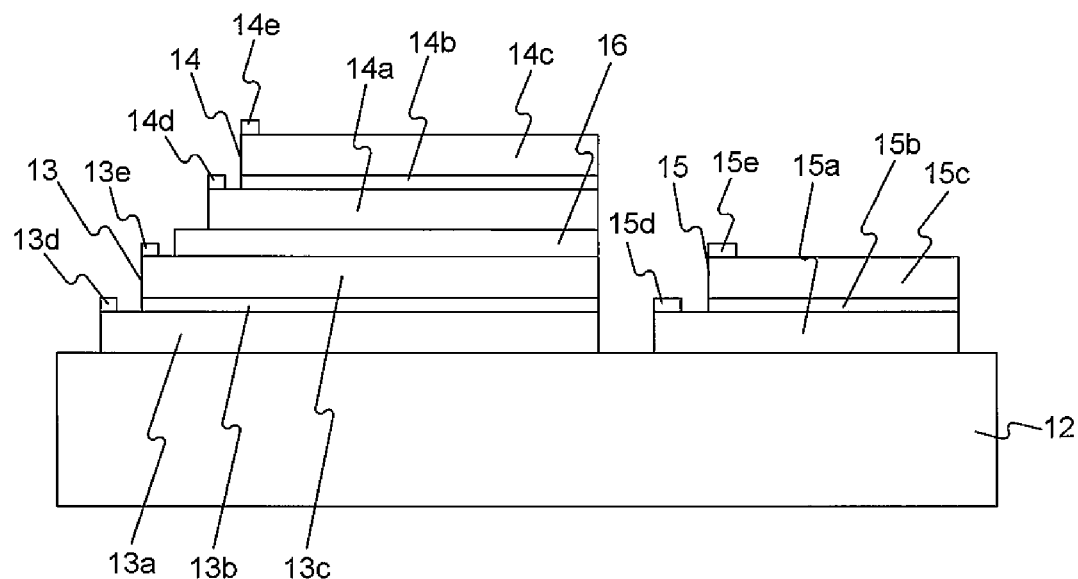
FIG. 3 shows a second pixel of a light emitting module consistent with principles of the present invention.

FIG. 3 shows a second pixel of a light emitting module consistent with principles of the present invention. In this embodiment, a pixel 11 in a light emitting module 10 as shown in FIG. 1 includes three micro-chip LED structures 13, 14, and 15 formed on a substrate 12. Micro-chip LED structures 13 and 14 are stacked on substrate 12 with an intermediate layer 16 interposed between for substantially separating micro-chip LED structures 13 and 14. Micro-chip LED structures 13 and 14 may emit a different color of light. Micro-chip LED structure 15 is also formed on substrate 12 and may be separate from micro-chip LED structures 13 and 14.

A process of forming pixel 11 is explained as follows. A lower layer 13a of micro-chip LED structure 13 is formed on substrate 12. An upper layer 13c and a light-emitting active layer 13b are formed on the lower layer 13a. In a process of forming upper layer 13c and light-emitting active layer 13b, at least a portion of an upper surface of lower layer 13a is left uncovered by upper layer 13c and light-emitting active layer 13b. A light transparent intermediate layer 16 is formed on a portion of the upper surface of layer 13c. In order to form an electrode pad coupled with layer 13c, at least a portion of the upper surface of layer 13c is left uncovered by intermediate layer 16. A lower layer 14a of micro-chip LED structure 14 is formed on intermediate layer 16. An upper layer 14c and a second light-emitting active layer 14b are formed on lower layer 14a. The formation process of one of layer 15c or layer 15a of micro-chip LED structure 15 may be in the same formation process in forming layers 13a, 13c, 14a, or 14c, for reducing the manufacturing process. For example, layer 15a may be formed in a process of forming layer 13a, and layer 15c may be formed in a process of forming layer 14c. Similar to the device structure of micro-chip LED structures 13 and 14, a portion of the upper surface of a lower layer of micro-chip LED structure 15 is left uncovered by layers 15b and 15c. Layer 15b is a light-emitting active layer of micro-chip LED structure 15. Electrode pads 13d, 13e, 14d, 14e, 15d, and 15e may be arranged on a surface portion of layers 13a, 13c, 14a, 14c, 15a, and 15c, respectively. A lead line (not shown) for inputting electrical currents to each micro-chip LED structure may be coupled to each electrode pad 13d, 13e, 14d, 14e, 15d, and 15e. In a specific embodiment, electrode pads 13d, 13e, 14d, 14e, 15d, and 15e may be formed simultaneously.

According to another aspect of the present invention, electrode pad 13e in FIG. 3 may be formed to cover a portion of intermediate layer 16 and be connected to electrode pad 14d. By this arrangement, it is possible to input driving current into layers 13c and 14a with one lead line, therefore, reducing manufacturing costs.

Alternatively, if electrode pads 13e and 14d are not connected through electrode pad 13e, electrode pads 13e and 14d may each couple with a lead line which further couples with the same electrical input, therefore, reducing the number of electrical inputs.

According to another aspect of the present invention, the formation of layers 14a, 14b, and 14c may be performed on a separate substrate. It may then be cut off from the substrate, with or without the substrate, and be placed on top of layer 13c. In this embodiment, light-transparent intermediate layer 16 which is formed on layer 13c may include an adhesive material for coupling the layer structure including at least layers 14a, 14b, and 14c to a layer structure including at least layers 13a, 13b, and 13c on substrate 12.

Alternatively, an adhesive (not shown) may be interposed between a layer structure including at least layers 14a, 14b, and 14c formed on a substrate other than substrate 12 and a layer structure including at least layers 13a, 13b, and 13c formed on substrate 12. The adhesive layer may comprise conductive particles so that it provides an electrical connection between layer 13c and 14a. When the adhesive layer is made to electrically connect layers 13c and 14a, it is possible to achieve inputting driving electric current into layers 13c and 14a with one lead line.

Figure 4:
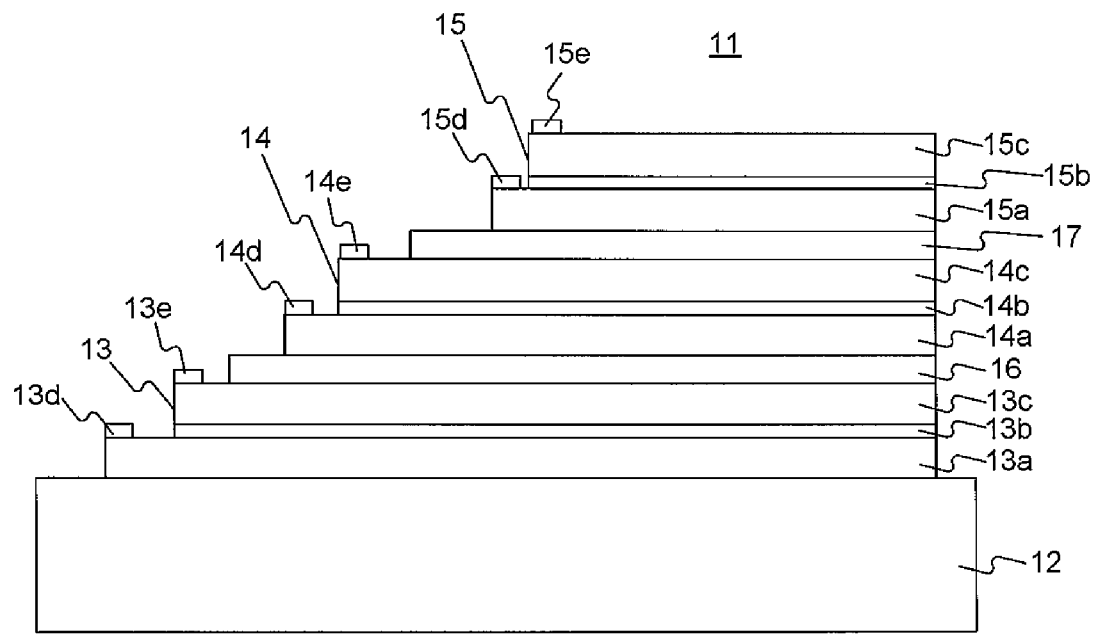
FIG. 4 shows a third pixel of a light emitting module consistent with principles of the present invention.

Referring to another embodiment consistent with the principles of the present invention, FIG. 4 shows a pixel 11 of light emitting module 10. As shown in FIG. 4, micro-chip LED structure 13 is formed on substrate 12, and micro-chip LED structure 14 is formed on micro-chip LED structure 13. A light-transparent intermediate layer 16 may be interposed between micro-chip LED structures 13 and 14. Further, a micro-chip LED structure 15 may be formed on micro-chip LED structures 14. A second light-transparent intermediate layer 17 may be interposed between micro-chip LED structures 14 and 15.

A process of forming pixel 11 is explained as follows. First, a lower layer 13a of micro-chip LED structure 13 is formed on substrate 12. An upper layer 13c and a light-emitting active layer 13b are formed on lower layer 13a. In a process of forming upper layer 13c and light-emitting active layer 13b, at least a portion of an upper surface of lower layer 13a is left uncovered by upper layer 13c and light-emitting active layer 13b. Light transparent intermediate layer 16 is formed on a portion of an upper surface of layer 13c. In order to form an electrode pad coupled with layer 13c, at least a portion of the upper surface of layer 13c is left uncovered by intermediate layer 16. A lower layer 14a of micro-chip LED structure 14 is, for example, subsequently formed on intermediate layer 16. An upper layer 14c and a second light-emitting active layer 14b are formed on lower layer 14a. Similarly, at least a portion of the upper surface of layer 14a may be left uncovered for adopting an electrode pad later.

Upon layer 14c, a second light-transparent intermediate layer 17 for providing a substantially electrical separation between micro-chip LED structures 14 and 15 is provided. A portion of an upper surface of layer 14c is left uncovered by second intermediate layer 17 for providing a connection to an electrode pad 14e. A lower layer 15a of micro-chip LED structure 15 is formed on the second intermediate layer 17. An upper layer 15c and a light-emitting active layer 15b are formed on lower layer 15a. Light-emitting active layer 15b is sandwiched between layer 15a and layer 15c. At least a portion of an upper surface of lower layer 15a is left uncovered by layers 15b and 15c for providing a connection to electrode pad 15d. Electrode pads 13d, 13e, 14d, 14e, 15d, and 15e may be arranged on a surface portion of each layer 13a, 13c, 14a, 14c, 15a, and 15c, respectively, for providing electrical driving currents to each micro-chip LED structure 13, 14, and 15. In accordance with one aspect of the present invention, electrode pads 13d, 13e, 14d, 14e, 15d, and 15e may be formed simultaneously.

According to another aspect, electrode pad 13e in FIG. 4 may be formed to cover a portion of intermediate layer 16 and be connected to electrode pad 14d. By this arrangement, only one lead line is needed to electrically coupled with both layers 13c and 14a, therefore, reducing manufacturing costs.

Alternatively, electrode pads 13e and 14d may each couple with a lead line which further couples with the same one electrical input, therefore, reducing the number of electrical inputs.

Similarly, electrode pad 14e in FIG. 4 may be formed to cover a portion of intermediate layer 17 and be connected to electrode pad 15d. By this arrangement, only one lead line is needed to electrically couple both layers 14c and 15a, thereby simplifying the manufacturing processes.

Alternatively, electrode pads 14e and 15d may be coupled with two lead lines which further couple with the same electrical input, thereby reducing the number of electrical inputs.

According to another aspect of the present invention, micro-chip LED structures 13, 14, and 15 may each be formed on different substrates and then be joined together to form a structure similar to that shown in FIG. 4. For example, micro-chip LED structure 13 is formed on substrate 12. Micro-chip LED structures 14 and 15 are each formed on a separate substrate. Micro-chip LED structures 14 and 15 are cut from their forming substrates and disposed on substrate 12. Micro-chip LED structure 14 is placed on micro-chip LED structure 13 through a light-transparent intermediate layer 16. Intermediate layer 16 may comprise an adhesive material for binding micro-chip LED structures 13 and 14. Similarly, micro-chip LED structure 15 is placed on micro-chip LED structure 14 through a second light-transparent intermediate layer 17. Intermediate layer 17 may also comprise an adhesive material for binding micro-chip LED structures 14 and 15. Further, intermediate layers 16 or 17 may include conductive particles for making an electrical connection between layers 13c and 14a, or between layers 14c and 15a. When intermediate layers 16 and 17 are made to electrically connect layers 13c and 14a, and 14c and 15a, respectively, it is possible to reduce lead lines for these layers.

Figure 5:
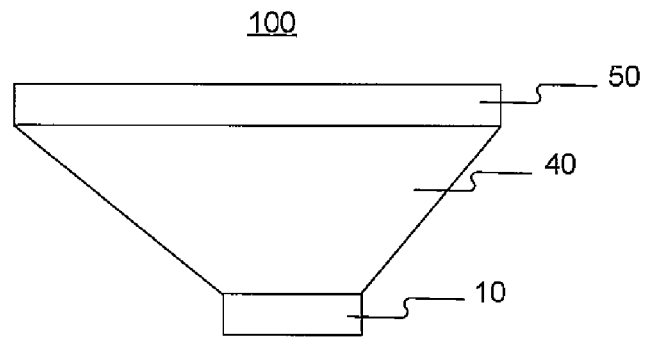
FIG. 5 shows flat panel display including a light emitting module consistent with principles of the present invention.

The light emitting module 10 including pixels of LED structures as described above can be adopted as a light source in a plurality of display devices, such as flat panel displays and projection displays. Each pixel 11 of light emitting module 10 may function as a pixel of an image on the screen of a flat panel display. A flat panel display 100 incorporating a light emitting module 10 consistent with principles of the present invention is shown in FIG. 5. In addition to light emitting module 10, flat panel display 100 may further comprise a light guide module 40 and a screen module 50. Light guide module 40 may function as an interface for transmitting light from light emitting module 10 to screen module 50. By the adoption of light emitting module 10, flat panel display 100 may have one or more of the following benefits: improved light efficiency, improved color reproduction, and user selection of preferred color and/or intensity of light.

Figure 6:
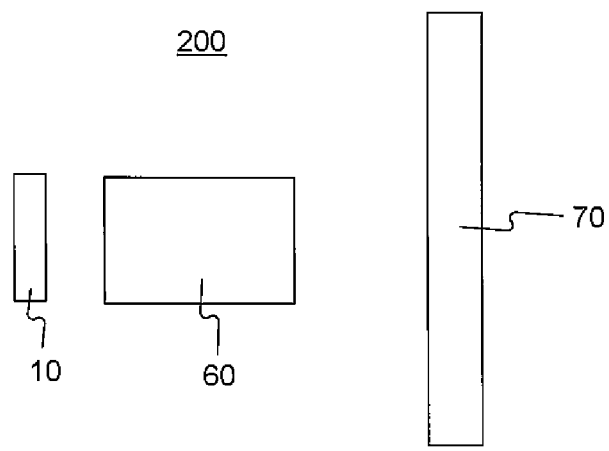
FIG. 6 shows a projection display including a light emitting module consistent with principles of the present invention.
Figure 7:
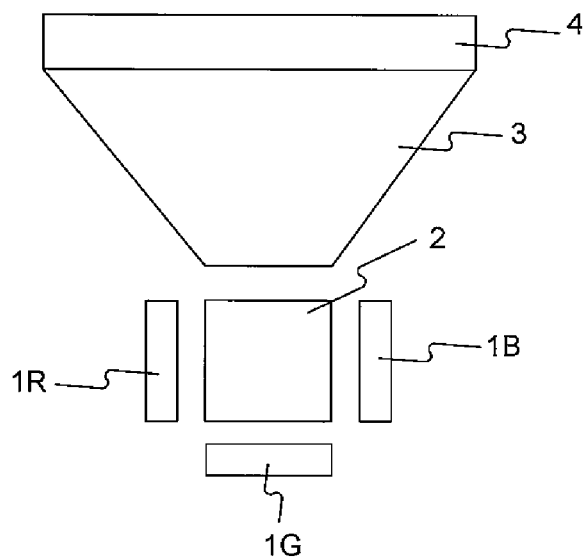
FIG. 7 shows a conventional projection display.
Figure 8:
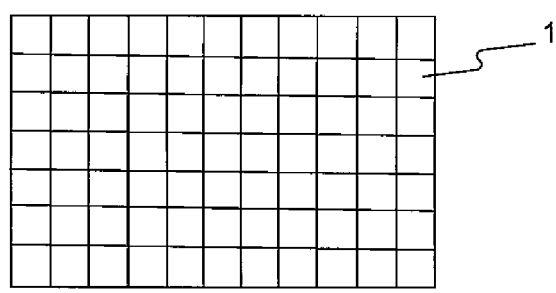
FIG. 8 shows a light emitting module in a conventional projection display.

The light emitting module 10 may also be used in a projection display as shown in FIG. 6. The projection display 200 may include a light emitting module 10, a projecting lens module 60, and a screen module 70. Light emitting module 10 may include a plurality of pixels. Each pixel may have the features illustrated in FIG. 2, 3, or 4, so that projection display 200 may have improved light efficiency, improved color reproduction, and/or provide a user with preferred color and intensity of light. Projecting lens module 60 projects images on light emitting module 10 to screen module 70. Each pixel 11 of light emitting module 10 may function as a pixel of an image on the screen of the projection display 200.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a plurality of light-emitting diode pixels arranged in a two-dimensional array, the method comprising:

simultaneously forming a plurality of first layers arranged in a two-dimensional array on a first chip substrate by deposition technique;

forming a plurality of second layers and a plurality of first light-emitting active layers on the first layers correspondingly;
forming a plurality of first intermediate layers on the second layers;
forming a plurality of third layers arranged in a two-dimensional array on a second chip substrate;
forming a plurality of fourth layers and a plurality of second light-emitting active layers on the third layers correspondingly;
placing the third layers, the fourth layers, and the second light-emitting active layers on the first intermediate layers; and
forming a plurality of first, a plurality of second, a plurality of third, and a plurality of fourth electrodes coupled with the first, second, third and fourth layers, respectively,
wherein the first light-emitting active layer is driven by the first and second electrodes to emit one color of light, and the second light-emitting active layer is driven by the third and fourth electrodes to emit another color of light.

2. The method of claim 1, wherein each of the first intermediate layers comprises an adhesive.

3. The method of claim 1, wherein each of the first intermediate layers comprises conductive particles.

4. The method of claim 1 further comprising:
exposing portions of upper surfaces of the first layers;
exposing portions of upper surfaces of the third layers; and
forming the plurality of first electrodes on the exposed portions of the upper surfaces of the first layers, the plurality of second electrodes on portions of upper surfaces of the second layers, the plurality of third electrodes on the exposed portions of the upper surfaces of the third layers, and the plurality of fourth electrodes on portions of upper surfaces of the fourth layers.

5. A method for forming a pixel of a micro-chip light-emitting diode light source, the method comprising:
simultaneously forming a first lower layer, a second lower layer, and a third lower layer on a chip substrate by deposition technique;
forming a first light-emitting active layer, a second light-emitting active layer, and a third light-emitting active layer on the first, second, and third lower layers respectively by deposition technique, wherein at least a portion of an upper surface of each of the first, second, and third lower layers is left uncovered by the first, second, and third light-emitting active layers respectively, wherein the first light-emitting active layer, the second light-emitting active layer, and the third light-emitting active layer emit different colors of light;
forming a first upper layer, a second upper layer, and a third upper layer on the first, second, and third light-emitting active layers respectively by deposition technique;
forming a first electrode pad, a second electrode pad, and a third electrode pad on the exposed upper surfaces of the first, second, and third lower layers respectively; and
forming a fourth electrode pad, a fifth electrode pad, and a sixth electrode pad on upper surfaces of the first, second, and third upper layers respectively,
wherein the first light-emitting active layer is driven by the first and second electrode pads to emit one color of light, the second light-emitting active layer is driven by the third and fourth electrode pads to emit another color of light, and the third light-emitting active layer is driven by the fifth and sixth electrode pads to emit the other color of light.

6. A method for forming a pixel of a micro-chip light-emitting diode light source, the method comprising:
forming a first lower layer on a chip substrate by deposition technique;
forming a first light-emitting active layer on the first lower layer by deposition technique;
forming a first upper layer on the first light-emitting active layer by deposition technique, wherein at least a portion of an upper surface of the first lower layer is left uncovered by the first light-emitting active layer and the first upper layer;
forming an intermediate layer on the first upper layer by deposition technique, wherein at least a portion of an upper surface of the first upper layer is left uncovered by the intermediate layer;
forming a second lower layer directly on the intermediate layer by deposition technique;
forming a second light-emitting active layer on the second lower layer by deposition technique;
forming a second upper layer on the second light-emitting active layer by deposition technique, wherein at least a portion of an upper surface of the second lower layer is left uncovered by the second light-emitting active layer and the second upper layer, wherein the first light-emitting active layer and the second light-emitting active layer emit different colors of light;
forming a first electrode pad and a second electrode pad on the exposed upper surfaces of the first and second lower layers respectively; and
forming a third electrode pad on the exposed upper surface of the first upper layer and forming a fourth electrode pad on an upper surface of the second upper layer.

7. The method of claim 6 further comprising;
forming a third lower layer directly on the intermediate layer by deposition technique;
forming a third light-emitting active layer on the third lower layer by deposition technique;
forming a third upper layer on the third light-emitting active layer by deposition technique, wherein at least a portion of an upper surface of the third lower layer is left uncovered by the third light-emitting active layer and the third upper layer, wherein the first light-emitting active layer, the second light-emitting active layer and the third light-emitting active layer emit different colors of light; and
forming a fifth electrode pad and a sixth electrode pad on the exposed upper surface of the third lower layer and an upper surface of the third upper layer respectively.

* * * * *